(12) United States Patent
Chen et al.

(10) Patent No.: US 12,538,615 B2
(45) Date of Patent: Jan. 27, 2026

(54) V-PIT-ENHANCED COMPONENT HAVING IMPROVED CHARGE CARRIER DISTRIBUTION

(71) Applicant: ams-OSRAM International GmbH, Regensburg (DE)

(72) Inventors: Xiaojun Chen, Penang (MY); Heng Wang, Eriskirch (DE); Jong Ho Na, Regensburg (DE); Alvaro Gomez-Iglesias, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 335 days.

(21) Appl. No.: 18/546,019

(22) PCT Filed: Feb. 17, 2021

(86) PCT No.: PCT/EP2021/053858
§ 371 (c)(1),
(2) Date: Aug. 10, 2023

(87) PCT Pub. No.: WO2022/174892
PCT Pub. Date: Aug. 25, 2022

(65) Prior Publication Data
US 2024/0120443 A1    Apr. 11, 2024

(51) Int. Cl.
*H10H 20/816*    (2025.01)
*H10H 20/812*    (2025.01)
*H10H 20/825*    (2025.01)

(52) U.S. Cl.
CPC ........ *H10H 20/816* (2025.01); *H10H 20/812* (2025.01); *H10H 20/8252* (2025.01)

(58) Field of Classification Search
CPC ............... H10H 20/816; H10H 20/812; H10H 20/8252; H10H 20/825; H10H 20/821; H10H 20/8215
See application file for complete search history.

(56) References Cited

U.S. PATENT DOCUMENTS 8,129,711 B2 * 3/2012 Kang .................. H10H 20/821
257/17
8,410,473 B2    4/2013 Tanaka
(Continued)

FOREIGN PATENT DOCUMENTS

EP          2151874 A2    2/2010

*Primary Examiner* — Mark W Tornow
(74) *Attorney, Agent, or Firm* — Slater Matsil, LLP (57) ABSTRACT

In embodiments a component includes a semiconductor layer sequence having a p-side semiconductor layer, an n-side semiconductor layer and an active zone located therebetween, wherein the active zone has a multiple quantum well structure including a plurality of quantum barrier layers and quantum well layers, the quantum barrier layers and the quantum well layers being arranged alternately along a vertical direction, wherein the active zone has at least one recess having facets extending obliquely to a main surface of the active zone, the recess being opened towards the p-side semiconductor layer, wherein, at least within the recess, the quantum barrier layers are n-doped and have a non-constant doping profile so that the component is configured to increase transport negatively charged charge carriers, from the n-side semiconductor layer towards the p-side semiconductor layer, based on the non-constant doping profile, and wherein, from the n-side semiconductor layer towards the p-side semiconductor layer, dopant concentrations of the quantum barrier layers gradually increase.

15 Claims, 8 Drawing Sheets

(56) References Cited

U.S. PATENT DOCUMENTS

| | | | |
|---|---|---|---|
| 2006/0246612 A1* | 11/2006 | Emerson | H10H 20/821 |
| | | | 438/42 |
| 2013/0001637 A1 | 1/2013 | Fudeta | |
| 2016/0043275 A1* | 2/2016 | Ting | H10H 20/8162 |
| | | | 257/13 |
| 2017/0263808 A1* | 9/2017 | Hyun | H10H 20/01 |
| 2017/0294554 A1 | 10/2017 | Tani et al. | |
| 2018/0083160 A1 | 3/2018 | Meyer et al. | |
| 2018/0226534 A1* | 8/2018 | Meyer | H10H 20/825 |
| 2020/0119228 A1* | 4/2020 | Lehnhardt | H10H 20/8215 |

* cited by examiner

V-PIT-ENHANCED COMPONENT HAVING IMPROVED CHARGE CARRIER DISTRIBUTION

CROSS-REFERENCE TO RELATED APPLICATIONS

This patent application is a national phase filing under section 371 of PCT/EP2021/053858, filed Feb. 17, 2021, which is incorporated herein by reference in its entirety.

TECHNICAL FIELD

This disclosure relates to a semiconductor component having homogenized charge carrier distribution and increased rate of radiative recombination as well as increased external quantum efficiency.

BACKGROUND

It is known that in an optoelectronic component comprising an active zone with a multiple quantum well (MQW) structure located between a p-side semiconductor layer and an n-side semiconductor layer, charge carriers within the active zone may not be evenly distributed over the entire MQW structure. This usually results in efficiency losses of such an optoelectronic component. In the presence of V-shaped pyramidal pits, i.e. V-pits, in the active zone, the transport of positively charged charge carriers, i.e. the hole transport, can be enhanced through injection via sidewalls of the V-pits into different quantum well layers (QWs) of the MQW structure. Even though the hole transport into deeper quantum well layers is improved via V-pits injection, the holes are still not evenly distributed across the whole MQW structure due to the low hole mobility.

So far, for improving the hole distribution in the MQW structure, much efforts have been made by optimizing the p-side growth conditions such as temperature, Mg doping profile or by optimizing the design of electron blocking layers for facilitating the hole injection. These methods, however, are quite complex, for instance due to interactions with other component properties of the component such as ESD endurance or robustness influenced by the Mg diffusion into the active zone. It is also very complex in terms of reproducibility in mass production of the component, since the layer thickness and the Mg doping level in particular within the V-pits cannot be easily characterized.

SUMMARY

Embodiments provide a component having increased efficiency, in particular a V-pit-enhanced component having improved charge carrier distribution.

According to at least one embodiment of a component, it has a semiconductor layer sequence comprising an active zone. The active zone is especially configured for generating electromagnetic radiation in the visible, ultraviolet or infrared spectral range. For example, the active zone has a multiple quantum well structure having a plurality of quantum barrier layers and a plurality of quantum well layers, wherein the quantum barrier layers and quantum well layers are arranged alternately along a vertical direction. Thus, within the multiple quantum well structure and up to peripheral quantum layers, any quantum well layer can be sandwiched between its two adjoining quantum barrier layers, and any quantum barrier layer can be sandwiched between its two adjoining quantum well layers.

A vertical direction is understood to mean a direction that is particularly perpendicular to a main surface of the active zone or of the semiconductor layer sequence. In particular, the vertical direction is parallel to a growth direction of the epitaxially grown semiconductor layer sequence of the component. A lateral direction is understood to mean a direction that runs parallel to the main surface of the active zone or of the semiconductor layer sequence. The vertical direction and the lateral direction are perpendicular to each other.

The active zone is located between a p-side and an n-side of the component, for example between a p-conducting, i.e. a p-side semiconductor layer and an n-conducting, i.e. an n-side semiconductor layer of the semiconductor layer sequence. The semiconductor layer sequence is based in particular on a III-V compound semiconductor material. A semiconductor layer sequence is based on a III-V compound semiconductor material has at least one element or elements from the third main group and at least one element or elements from the fifth main group of the periodic table of chemical elements. Furthermore, it is also possible that the semiconductor layer sequence is based on a II-VI compound semiconductor material. For example, the component is an optoelectronic component, such as a light-emitting diode (LED).

According to at least one embodiment of the component, at least one or a plurality of recesses are formed in the region of the active zone facing the p-side, i.e. on the side of the p-side semiconductor layer. In the direction from the p-side towards the n-side of the component, the recess has a decreasing cross section. In sectional view, the recess is for instance V-shaped. For example, the recess has the shape of an inverse pyramid comprising for instance a hexagonal cross section and six facets, an inverse truncated pyramid, an inverse cone or a truncated cone. The recess or the plurality of recesses can be formed by one or a plurality of V-pits. Such a V-pit in the semiconductor layer sequence can be produced by adjusting suitable growth parameters such as the growth rate in an epitaxy process, the temperature or pressure in an epitaxy reactor and/or the type as well as the concentration of the dopants and/or the material composition for example with respect to the III-V or II-VI material ratio in the individual layers of the semiconductor layer sequence.

According to at least one embodiment of the component, the active zone has a main surface which runs substantially parallel to a c-plane of the semiconductor layer sequence. In particular, the main surface of the active zone is a c-surface. A c-surface, i.e. (0001)-surface, is understood to mean a crystal surface having a c-direction, i.e. having a <0001>-crystal orientation. The semiconductor layer sequence can be epitaxially applied onto a front surface of a substrate, in particular of a growth substrate. For example, the front surface of the growth substrate is a c-surface. If the layers of the semiconductor layer sequence are epitaxially deposited on the front surface of the substrate being a c-surface, the respective layers of the semiconductor layer sequence generally exhibit a <0001>-orientation. The layers of the semiconductor layer sequence can therefore have a c-surface, i.e. a (0001)-surface, as the main surface.

In at least one embodiment of the component, it has a semiconductor layer sequence comprising a p-side semiconductor layer, an n-side semiconductor layer and an active zone located therebetween. The active zone has a multiple quantum well structure comprising a plurality of quantum barrier layers and quantum well layers, wherein the quantum barrier layers and the quantum well layers are arranged alternately along a vertical direction. The active zone comprises at least one recess having facets extending obliquely to a main surface of the active zone, wherein the recess is opened towards the p-side semiconductor layer, and at least within the recess, the quantum barrier layers are n-doped and have a non-constant doping profile, so that in operation of the component, from the n-side semiconductor layer towards the p-side semiconductor layer, the transport of negatively charged charge carriers is increased in virtue of the non-constant doping profile.

In particular, the quantum barrier layers are n-doped, for instance with Si. In this disclosure, if not explicitly stated otherwise, the dopant concentration shall refer to n-dopant concentration. If a quantum barrier layer has a high dopant concentration, for example a high Si-dopant concentration, an injection of negatively charged charge carriers into a quantum well layer adjoining this quantum barrier layer is made less difficult than in the case of a quantum barrier layer having a lower dopant concentration. Thus, by starting with a low dopant concentration and gradually increasing the dopant concentration along the vertical direction towards the p-side semiconductor layer, negatively charged charge carriers are effectively slowed down compared to the case of all quantum barrier layers having a constant high dopant concentration. Moving from regions with low dopant concentration to regions with high dopant concentration, the transport of negatively charged charge carriers is increased. In other words, from the n-side semiconductor layer towards the p-side semiconductor layer, negatively charged charge carriers have increasing mobility in virtue of the non-constant doping profile.

Hence, using n-doped quantum barrier layers have a non-constant doping profile, the rate of radiative recombination in the quantum well layers close to the n-side semiconductor layer is increased, since sufficient amount of positively charged charge carriers injected from the p-side semiconductor layer will have sufficient time to arrive at the quantum well layers close to the n-side semiconductor layer and recombine with negatively charged charge carriers under emission of photons.

Thus, by using a non-constant doping profile rather than using a constant doping profile, an enhancement of the efficiency of the component can be obtained, since positively charged charge carriers from the p-side semiconductor layer and negatively charged charge carriers from the n-side semiconductor layer are distributed quite homogeneously within the active zone. In this case, with regard to the charge carrier density, the non-constant doping profile results in an improved balance between the comparatively fewer mobile holes and the more mobile electrons in the whole multiple quantum well structure of the active zone.

According to at least one embodiment of the component, from the n-side semiconductor layer towards the p-side semiconductor layer, the dopant concentrations of the quantum barrier layers gradually increase.

If the dopant concentrations of the quantum barrier layers gradually increase, it does not necessarily mean that along the vertical direction, the dopant concentration has to increase in a strictly monotonous or continuous manner. Rather, the increase or the growth of the dopant concentration can be stepwise or discontinuous, i.e. in jumps. Furthermore, up to some production tolerances causing some fluctuations, for instance of at most 10%, 7%, 5%, 3% or 1%, the dopant concentration may slightly decrease before it strongly increases again, wherein here in this disclosure, the difference given in percentage in particular refers to the minuend. If the dopant concentrations of the quantum barrier layers gradually increase, in a diagram describing the values of the dopant concentrations in terms of the vertical positions of the quantum barrier layers in the active zone, in particular the curve fit shall increase. In contrast to the dopant concentrations, it is possible for the curve fit to increase in a strictly monotonous manner.

Compared to the case of quantum barrier layers having a constant doping profile resulting in substantially constant mobility of the negatively charged charge carriers (electrons) throughout the active zone, in the case of quantum barrier layers having non-constant doping profile, the negatively charged charge carriers have different transport properties in different quantum barrier layers. In particular, when electrons are injected from the n-side semiconductor layer into the active zone, due to low dopant concentrations in the quantum barrier layers close to the n-side semiconductor layer, the electrons at first have low mobility or low transport. With increasing distance from the n-side semiconductor layer, the dopant concentration of the quantum barrier layers increases, resulting in a higher mobility or transport of the electrons. Thus, radiative recombination under emission of photons may occurs more evenly throughout all quantum well layers of the active zone.

According to at least one embodiment of the component, the active zone comprises a plurality of recesses having facets extending obliquely to the main surface of the active zone, wherein the recesses are opened towards the p-side semiconductor layer. The recesses are formed for instance as V-pits. In particular, in each of the plurality of recesses, the quantum barrier layers are n-doped and have a non-constant doping profile, for instance any of the non-constant doping profiles described in this disclosure. For example, up to production tolerances, the quantum barrier layers have the same non-constant doping profile in different recesses.

According to at least one embodiment of the component, the quantum barrier layers are divided into a plurality of subgroups. Up to production tolerances for instance of at most 10%, 7%, 5%, 3% or of at most 1%, the quantum barrier layers of the same subgroup can have the same dopant concentration. The quantum barrier layers of the different subgroups, however, can have different dopant concentrations.

For example, the dopant concentrations or the average dopant concentrations of the different subgroups differ from each other by at least 3%, 5%, 7%, 10%, 15%, 20% or by at least 25%, for example between 3% and 35% inclusive, between 3% and 30% inclusive, between 3% and 25% inclusive, between 3% and 20% inclusive, between 3% and 15% inclusive, between 3% and 15% inclusive or between 3% and 10% inclusive. In particular, the quantum barrier layers of the subgroups having larger vertical distance to the n-side semiconductor layer have higher dopant concentrations than the quantum barrier layers of the subgroups having shorter vertical distance to the n-side semiconductor layer.

For instance, each subgroup can comprise at least 2, 3, 5 or 7 quantum barrier layers, for instance between 2 and 10 inclusive, for instance between 2 and 5 inclusive. It is also possible that the number of quantum barrier layers in some subgroups is more than 10, or in some special cases exactly 1. If the number of quantum barrier layers in one subgroup is more than 1, the increase or growth of the dopant concentration of this subgroup may occur in groups and not individually for each quantum barrier layer of the subgroup.

According to at least one embodiment of the component, each subgroup of the quantum barrier layers has an average dopant concentration, and from the n-side semiconductor layer towards the p-side semiconductor layer, the average dopant concentrations of different subgroups gradually increase. In other words, the average dopant concentration of the quantum barrier layers of a subgroup having a larger vertical distance to the n-side semiconductor layer is greater than the average dopant concentration of the quantum barrier layers of a subgroup having a smaller vertical distance to the n-side semiconductor layer.

According to at least one embodiment of the component, the quantum barrier layers are divided into p-side quantum barrier layers and n-side quantum barrier layers. Up to production tolerances for instance of at most 10%, 7%, 5%, 3% or of at most 1%, the p-side quantum barrier layers can have the same dopant concentration. In particular, one of the p-side quantum barrier layers has a highest dopant concentration of all quantum barrier layers, for instance in the whole active zone. Outside the active zone, it is possible that the semiconductor layer sequence of the component comprises a barrier structure, such as a hole barrier structure, which can have higher dopant concentration. Such a barrier structure, which usually has the form of a superlattice structure, shall not be considered as quantum barrier layers inside the active zone of the component. The p-side quantum barrier layers are located between the p-side semiconductor layer and the n-side quantum barrier layers, wherein all n-side quantum barrier layers may have lower dopant concentrations than the p-side quantum barrier layers.

For example, the non-constant doping profile in the multiple quantum well structure is not or not substantially reflected by the dopant concentrations of the p-side quantum barrier layers, since up to production tolerances, the p-side quantum barrier layers can be considered as having a constant doping profile. The p-side quantum barrier layers are defined in particular by a group of quantum barrier layers, which have substantially the same dopant concentrations and from all quantum barrier layers—are furthest away from the n-side semiconductor layer. All remaining quantum barrier layers, which—compared to the p-side quantum barrier layers—are located closer to the n-side semiconductor layer can be considered as n-side quantum barrier layers.

The highest dopant concentration or an average dopant concentration of the p-side quantum barrier layers can form a reference dopant concentration (Ref) for all the quantum barrier layers. By defining such a reference dopant concentration, the dopant concentration of each of the quantum barrier layers or an average dopant concentration of a subgroup of the quantum barrier layers can be expressed a ratio to this reference dopant concentration. The dopant concentration of the quantum barrier layers of the multiple quantum well structure can vary between 1E+17 and 5E+19 atoms/cm$^3$, for instance between 5E+17 and 5E+19 atoms/cm$^3$ or between 5E+17 and 1E+19 atoms/cm$^3$. The highest dopant concentration or the average dopant concentration of the p-side quantum barrier layers, i.e. the reference dopant concentration, can be between 1E+18 and 5E+19 atoms/cm$^3$, for instance between 5E+18 and 5E+19 atoms/cm$^3$ or between 5E+18 and 1E+19 atoms/cm$^3$.

According to at least one embodiment of the component, the p-side quantum barrier layers have an average dopant concentration which forms the reference dopant concentration Ref for the quantum barrier layers, wherein the dopant concentration of each of the p-side quantum barrier layers differs from the reference dopant concentration Ref by at most 10%, 7%, 5%, 3% or by at most 1%. In particular, an average dopant concentration all n-side quantum barrier layers is between 0.3Ref and 0.8Ref inclusive, for instance between 0.3Ref and 0.7Ref inclusive, between 0.3Ref and 0.6Ref inclusive or between 0.3Ref and 0.5Ref inclusive.

According to at least one embodiment of the component, the non-constant doping profile in the multiple quantum well structure is reflected by different dopant concentrations of the n-side quantum barrier layers. From the n-side semiconductor layer towards the p-side semiconductor layer, the dopant concentrations of the n-side quantum barrier layers in particular gradually increase. Up to production tolerances for instance of at most 10%, 7%, 5%, 3% or of at most 1%, the dopant concentrations of the n-side quantum barrier layers can increase from zero, 0.1Ref, 0.2Ref, 0.3Ref to 0.6Ref, 0.7Ref, 0.8Ref, 0.9Ref, 0.95Ref or even to Ref.

According to at least one embodiment of the component, at least one or one first subgroup of the n-side quantum barrier layers has the lowest dopant concentration of all quantum barrier layers. For example, the first subgroup of the n-side quantum barrier layers has the lowest average dopant concentration of all subgroups.

The lowest dopant concentration can be between 0.1Ref and 0.8Ref, 0.2Ref and 0.8Ref, 0.3Ref and 0.8Ref, 0.4Ref and 0.8Ref, 0.5Ref and 0.8Ref, or between 0.6Ref and 0.8Ref, or for instance between 0.3Ref and 0.7Ref, or between 0.4Ref and 0.6Ref. In particular, from all quantum barrier layers, the n-side quantum barrier layer or the first subgroup of the n-side quantum barrier layers having the lowest dopant concentration is located closest to the n-side semiconductor layer.

According to at least one embodiment of the component, at least 10% and at most 90% of all quantum barrier layers in the multiple quantum well structure are n-side quantum barrier layers. In this case, the non-constant doping profile in the multiple quantum well structure is substantially described by the dopant concentrations for example of only 10%, 20%, 30%, 40%, 50%, 60%, 70%, 80% or 90% of the quantum barrier layers. Is the non-constant doping profile in the multiple quantum well structure substantially described by the dopant concentrations of at most 70%, 80% or of at most 90% of all quantum barrier layers, this non-constant doping profile in the active zone can be referred to as the case of partially "chirped" n-doping in the quantum barrier layers. Otherwise, if the non-constant doping profile in the multiple quantum well structure is substantially described by the dopant concentrations of more than 70%, 80% or more than 90% of all quantum barrier layers, the non-constant doping profile in the active zone may be referred to as the case of fully "chirped" n-doping in the quantum barrier layers.

It is possible that at least 10% and at most 70% of all quantum barrier layers in the multiple quantum well structure are n-side quantum barrier layers. It is also possible that at least 10% and at most 50% or at most at most 40% of all quantum barrier layers in the multiple quantum well structure are n-side quantum barrier layers. Furthermore, it is also possible, that at least 10% and at most 30% or at most at most 20% of all quantum barrier layers in the multiple quantum well structure are n-side quantum barrier layers.

Significant positive effects with regard to radiative recombination in the lowest quantum well layers, which are located close to the n-side semiconductor layer, have been observed via simulations and in experiments in case of partially chirped n-doping in the quantum barrier layers, in particular already by 10% or by 20% chirped n-doping. These effects even increase by higher chirped n-doping, resulting in an enhancement of internal quantum efficiency and thus in an enhancement of efficiency of the component.

According to at least one embodiment of the component, from the n-side semiconductor layer towards the p-side semiconductor layer, the dopant concentrations of the quantum barrier layers gradually increase individually or in groups, wherein different quantum barrier layers or different subgroups of quantum barrier layers have different dopant concentrations. This case can be referred to as the case of fully or completely "chirped" n-doping in the quantum barrier layers in the active zone. In this case, the non-constant doping profile is described by all quantum barrier layers. The number of the p-side quantum barrier layers may be reduced to 1 or is for example less than 30%, 20%, 10%, 5% or less than 3% of the total number of the p-side quantum barrier layers.

Here, in particular in the case of fully or completely chirped doping, the dopant concentrations of any two adjacent the quantum barrier layers or of any two adjacent subgroups can differ from each other by at least 2%, 3%, 5%, 7%, 10%, 15%, 20% or by at least 25%, for example between 2% and 35% inclusive, between 2% and 25% inclusive, between 2% and 20% inclusive, between 2% and 15% inclusive, between 2% and 10% inclusive, between 2% and 7% inclusive or between 2% and 5% inclusive. In all cases of chirped doping, the number of quantum barrier layers or the number of quantum well layers can be between 5 and 50 inclusive, between 5 and 40 inclusive, between 5 and 30 inclusive, preferably between 5 and 20 inclusive or between 5 and 15 inclusive. For example, the number of quantum barrier layers or the number of quantum well layers is at least 5, 10, 15 or at least 20.

According to at least one embodiment of the component, also outside the recess, the quantum barrier layers are n-doped and exhibit a non-constant doping profile. In particular, the non-constant doping profile within the recess and the non-constant doping profile outside the recess have the same trend. Up to production tolerances, the quantum barrier layers inside and outside the recess or recesses can have the same non-constant doping profile.

According to at least one embodiment of the component, the semiconductor layer sequence or the active zone is based on an InGaN/GaN structure. In particular, the quantum barrier layers are doped with Si. Here, it shall be emphasized that in general, this disclosure is not limited only to the case of InGaN/GaN structure having Si-doped quantum barrier layers. Rather, the semiconductor layer sequence or the active zone may be based on another III-V or II-VI compound semiconductor material and the quantum barrier layers may have other appropriate dopants.

DETAILED DESCRIPTION OF ILLUSTRATIVE EMBODIMENTS

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

Figure 1A:
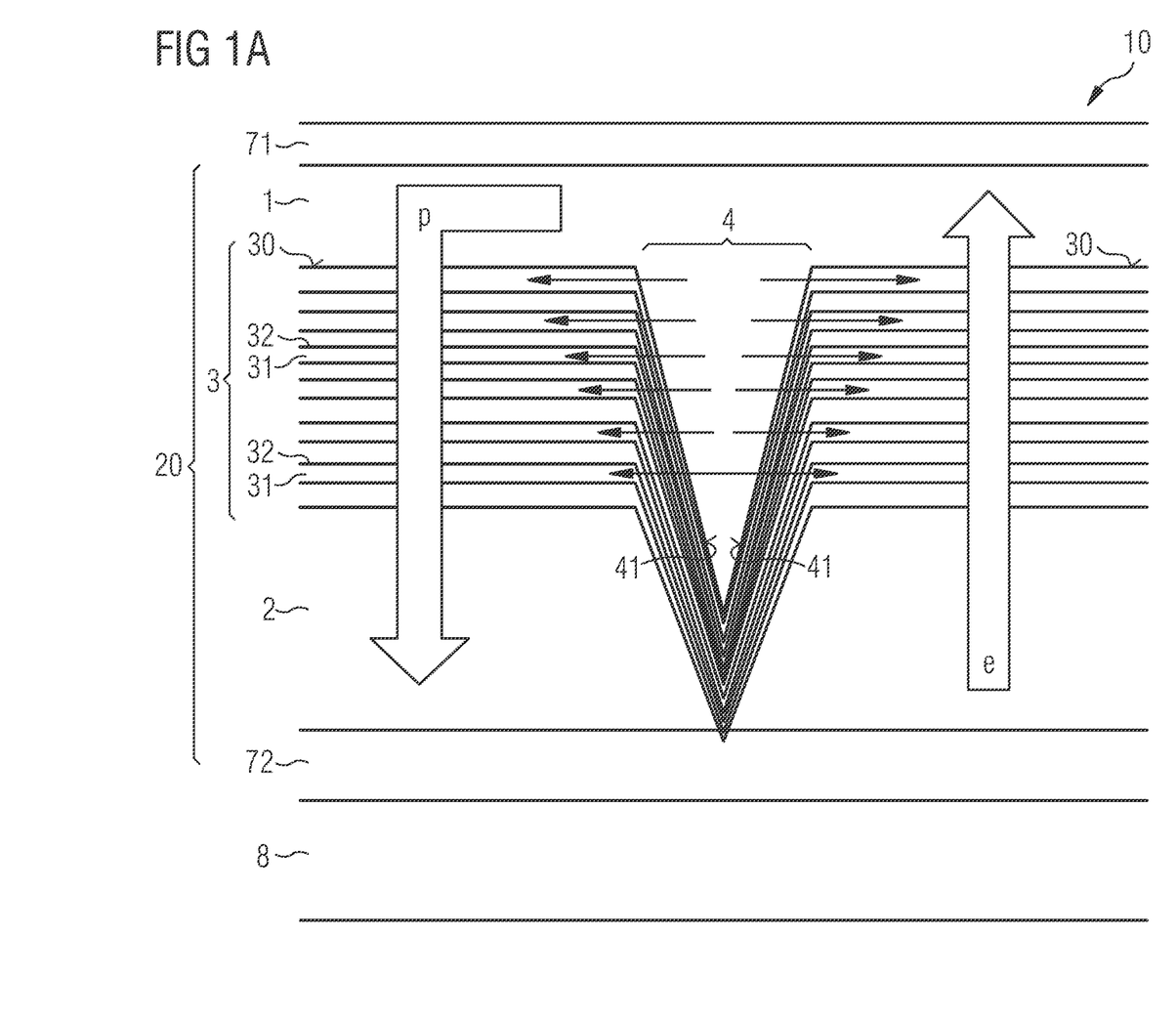
FIG. 1A shows a schematic illustration of an example of a component having at least one V-pit.

FIG. 1A shows a component 10 having a carrier 8 on which a semiconductor layer sequence 20 is arranged. The carrier 8 can be a growth substrate on which the semiconductor layer sequence 20 has been epitaxially grown. The semiconductor layer sequence 20 has an active zone 3 which is arranged between a p-side semiconductor layer 1 and an n-side semiconductor layer 2. In particular, the active zone 3 is configured for generating electromagnetic radiation during operation of the component 10.

In particular, the carrier 8 is a growth substrate having a main surface being a c-surface on which the semiconductor layer sequence 20 is epitaxially grown. The active zone 3 comprises at least one recess 4 having facets 41 extending obliquely to a main surface 30 of the active zone 3, wherein the recess 4 is opened towards the p-side semiconductor layer 1. The active zone 3 can have a plurality of such recesses 4. In particular outside the recess 4 or outside the recesses 4, the active zone 3 has a main surface 30 which faces the p-side semiconductor layer 1. The main surface 30 can be a c-surface.

The active zone 3 has a multiple quantum well structure comprising a plurality of alternating quantum well layers 31 and quantum barrier layers 32. The number of quantum well layers 31 is at least 5 and is for example between 5 and 50 inclusive, for instance between 5 and 30 inclusive, for instance 13. The quantum well layers 31 and quantum barrier layers 32 may be based on a III-V compound semiconductor material, for instance on InGaN and GaN, respectively. During operation of the component 10, positively charged charge carriers p, namely holes from the p-side semiconductor layer 1, and negatively charged charge carriers e, namely electrons from the direction of the n-side semiconductor layer 2, are injected into the active zone 3 for generating radiation.

A further semiconductor layer 72 is arranged between the carrier 8 and the n-side semiconductor layer 2. This further semiconductor layer 72 can be formed as a hole barrier structure, a transition layer, a contact layer or combination therefrom.

Figure 1B:
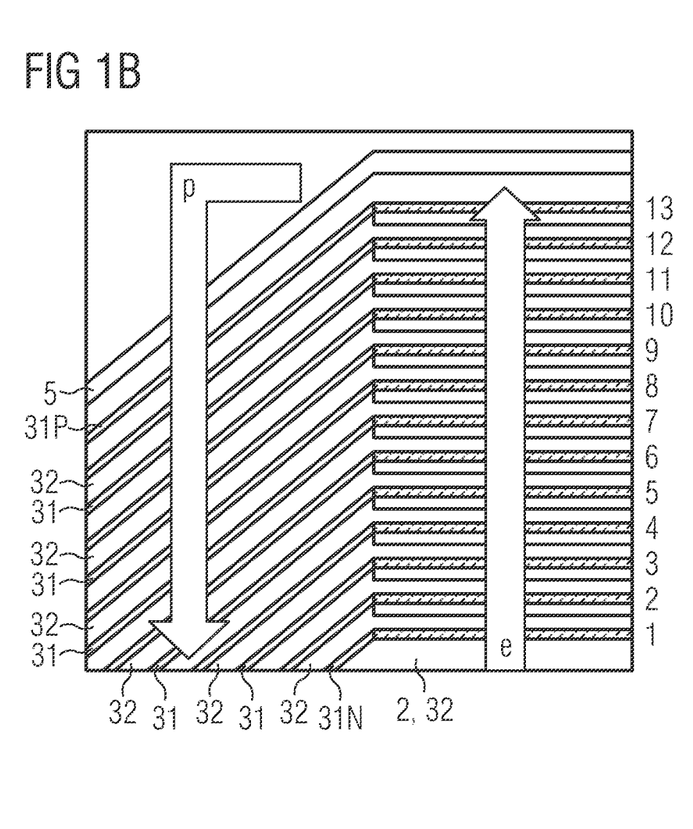
FIG. 1B shows a schematic illustration of a comparative example of a component and some experimental results regarding different rates of radiative recombination in different quantum well layers.

The p-side semiconductor layer 1 is arranged between the active zone 3 and a top semiconductor layer 71. The semiconductor layer 71 can be formed as a contact layer or as a top layer of the component 10. It is possible that the component 10 comprises an electron barrier structure 5 (not shown in FIG. 1A, see FIG. 1B, however, for example) which is arranged for instance between the active zone 3 and the semiconductor layer 71 or between the active zone 3 and the p-side semiconductor layer 1. As shown in FIG. 1B, within the production tolerances, the electron barrier structure 5 run for instance conformally to the facets 41 of the recess or recesses at least in places. Outside the recess 4, the barrier structure 5 can have a c-surface as its main surface. In the regions of the recess 4, similar to the active zone 3, the barrier structure 5 has facets whose orientation differs from that of the c-surface.

In the presence of the recess 4 or of a plurality of recesses 4 it can be achieved that positively charged charge carriers p are injected more efficiently into the active zone 3, in particular into various quantum well layers 31 via the facets 41 of the recess 4 or of the recesses 4, since the p-side semiconductor layer 1 extends into the recess 4 or into the recesses 4, and positively charged charge carriers p are injected not only along the vertical direction but also along lateral directions into various quantum well layers 31 at different vertical levels and recombine with negatively charged charge carriers e there. In particular, due to the reduced layer thicknesses on the facets 41, a spatial distance from the lower, i.e. n-side, quantum well layers 31 to the p-side semiconductor layer 1 is effectively reduced, for instance in comparison with other regions of the p-side semiconductor layer 1 outside the recess 41.

As schematically shown in FIG. 1B, however, for the case of the active zone 13 having for instance 13 quantum well layers 31 and the quantum barrier layers 32 having a constant or substantially doping profile, in a color-coded experiment, it has been found that in particular in the lowest n-side quantum well layers 31 (see in particular the 1st and 2nd quantum well layers 31) or in the highest p-side quantum well layers 31 (see in particular the 12th and 13th quantum well layers 31), the rate of radiative recombination for different colors C1, C2, C3, C4 and C5 remains low.

In particular in the 1st and 2nd quantum well layers 31 and also in the 3rd quantum well layer 31, only a low rate of radiative recombination can be achieved due to the unequal distribution of positively charged charge carriers p in the MQW structure. More concretely, the hole concentration significantly decreases from the middle quantum well layers to deeper or lower quantum well layers near the n-side. This is due to the extraordinary high rates of radiative recombination in the middle quantum well layers. The highest rates of radiative recombination for different colors are obtained in the 4th to 11th quantum well layers 31. Thus, the deepest three quantum well layers 31 near the n-side suffer a lot from the low hole concentrations there. Also the highest two quantum well layers 31 near the p-side, i.e. the first p-side quantum well layer 31p and its neighboring quantum well layer 31, suffer from the unequal distribution of charge carriers in the MQW structure. This leads to a lowering in brightness because of the strong droop effect induced by the so-called Auger effect. This effect is even more severe due to the non-uniformity of the charge carrier distribution.

Figure 2A:
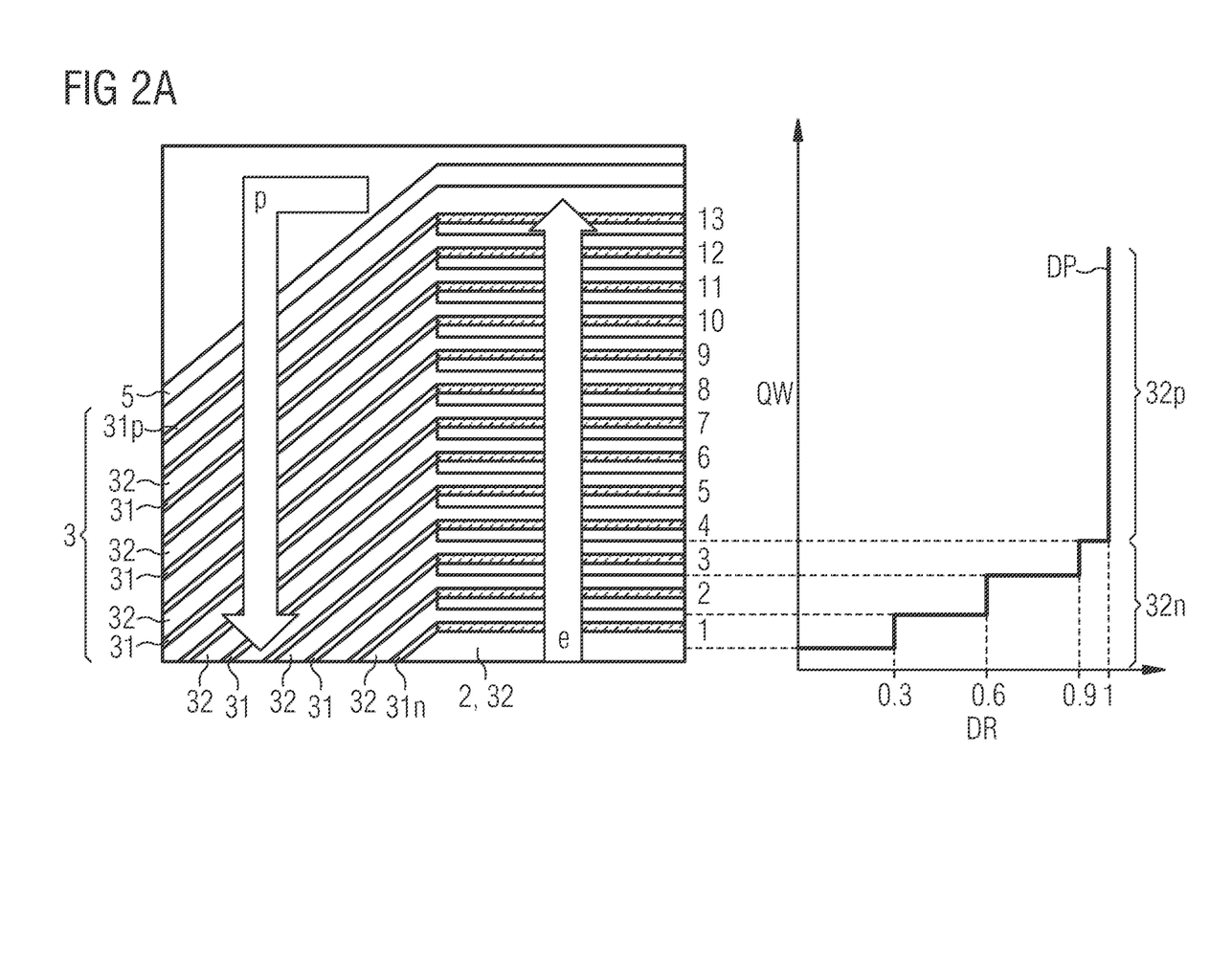
FIG. 2A shows a schematic illustration of an exemplary embodiment of a component.

The negative effect described above can be reduced if the quantum barrier layers 32 have a non-constant doping profile DP as shown for instance in FIG. 2A.

According to FIG. 2A, the quantum barrier layers 32 are divided into p-side quantum barrier layers 32p and n-side quantum barrier layers 32n. The n-side quantum barrier layers 32n are the quantum barrier layers 32 adjoining the first three quantum well layers 31 near the n-side semiconductor layer 2. The p-side quantum barrier layers 32p are the quantum barrier layers 32 adjoining the 4th to 13th quantum well layers 31.

As shown in FIG. 2A, in particular up to production tolerances for instance of at most 10%, 7%, 5%, 3% or 1%, the p-side quantum barrier layers 32p may have the same dopant concentration which defines the reference dopant concentration Ref. Thus, a doping rate DP of the p-side quantum barrier layers 32p is around 1. Hence, up to production tolerances, the p-side quantum barrier layers 32p have a constant doping profile. In contrast, the n-side quantum barrier layers 32n exhibits a non-constant doping profile DP in the multiple quantum well structure. In other words, the non-constant doping profile DP in the multiple quantum well structure is reflected by different dopant concentrations of the n-side quantum barrier layers 32n.

In particular, from the n-side semiconductor layer 2 towards the p-side semiconductor layer 1, the dopant concentrations of the n-side quantum barrier layers 32n gradually increase. Only as an example, according to FIG. 2A, the doping rate DR of the first n-side quantum barrier layer 32n relative to the reference dopant concentration is between 0 and 0.3, the doping rate DR of the second n-side quantum barrier layer 32n is between 0.3 and 0.6, the doping rate DR of the third n-side quantum barrier layer 32n is between 0.6 and 0.9 and the doping rate DR of the fourth n-side quantum barrier layer 32n is between 0.9 and 1.

In particular, the quantum barrier layers 32 adjoining the first quantum well layer 31n can have an average doping rate DR of 0.3. The quantum barrier layers 32 adjoining the second quantum well layer 31 can have an average doping rate DR of 0.5, and the quantum barrier layers 32 adjoining the third quantum well layer 31 can have an average doping rate DR of 0.9. Such a non-constant doping profile can be referred to as the case of partially chirped n-doping in the quantum barrier layers 32 in the active zone 3, since a large proportion of the quantum barrier layers 32, namely the p-side quantum barrier layers 32p, have substantially constant dopant concentration. In practice, the dopant concentration of each quantum barrier layer 32 can be detected using SIMS (Secondary Ion Mass Spectroscopy).

Figure 2B:
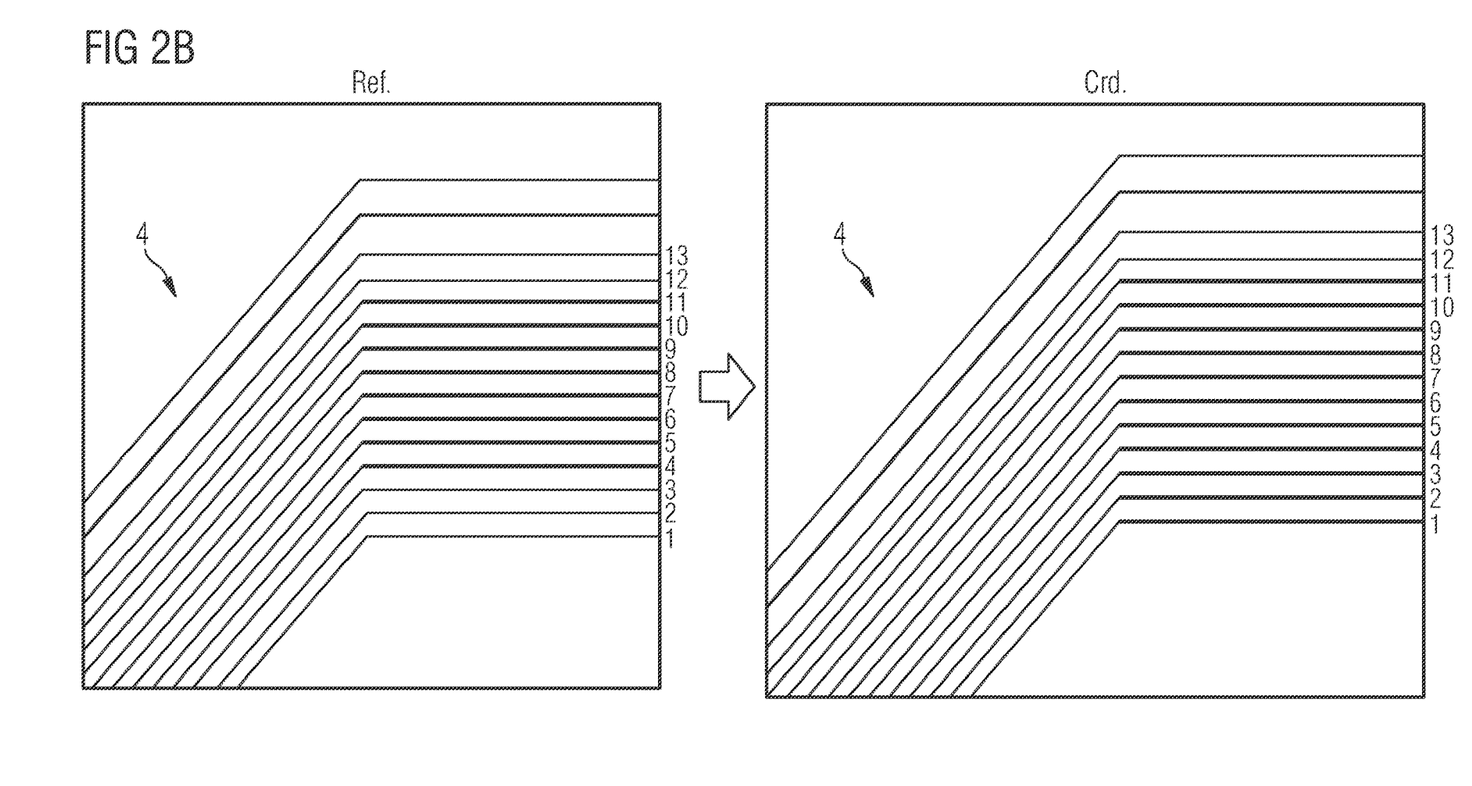
FIGS. 2B, 2C and 2D show schematic illustrations of some comparisons between the comparative example of a component and the exemplary embodiment of a component.
Figure 2C:
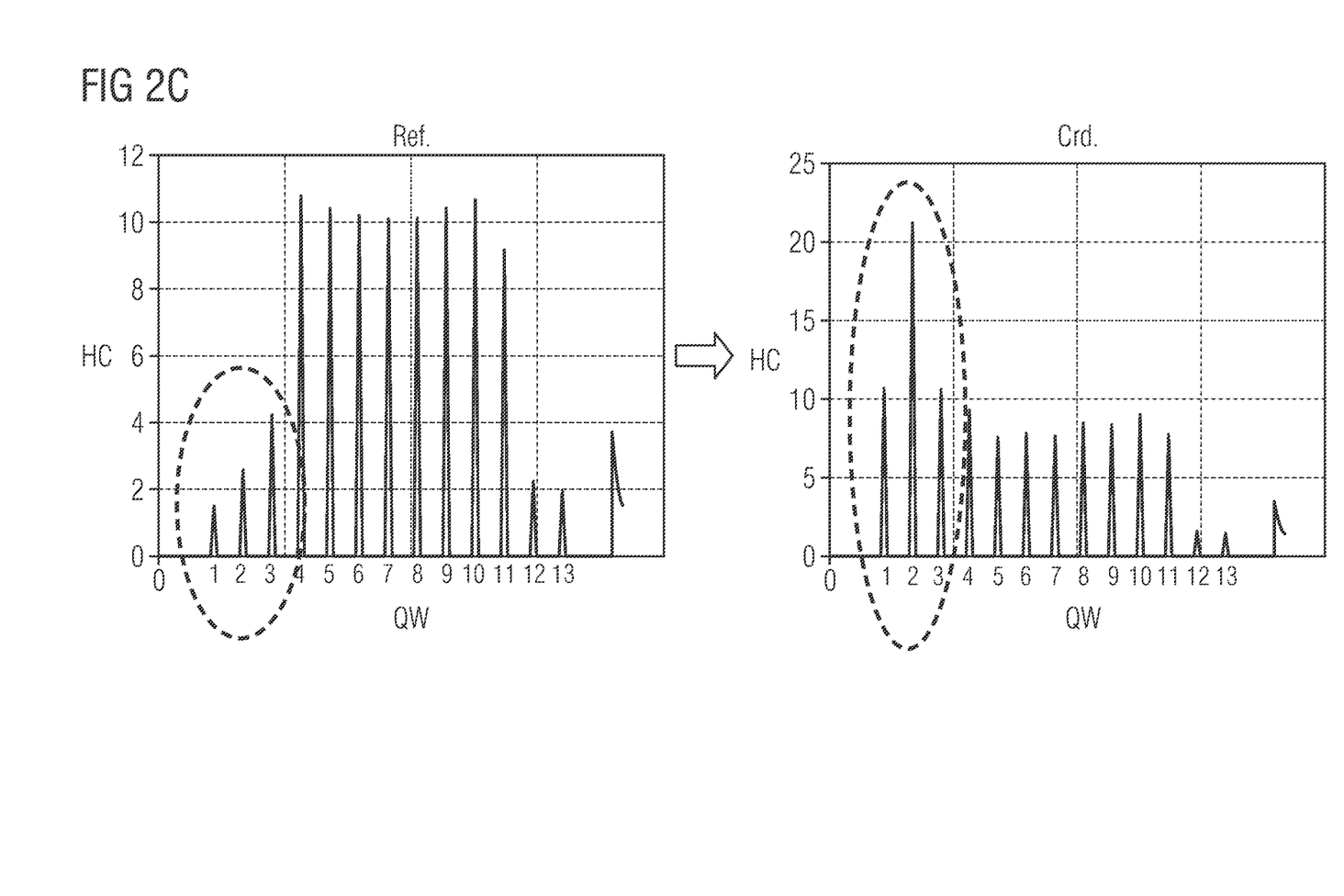
Figure 2D:
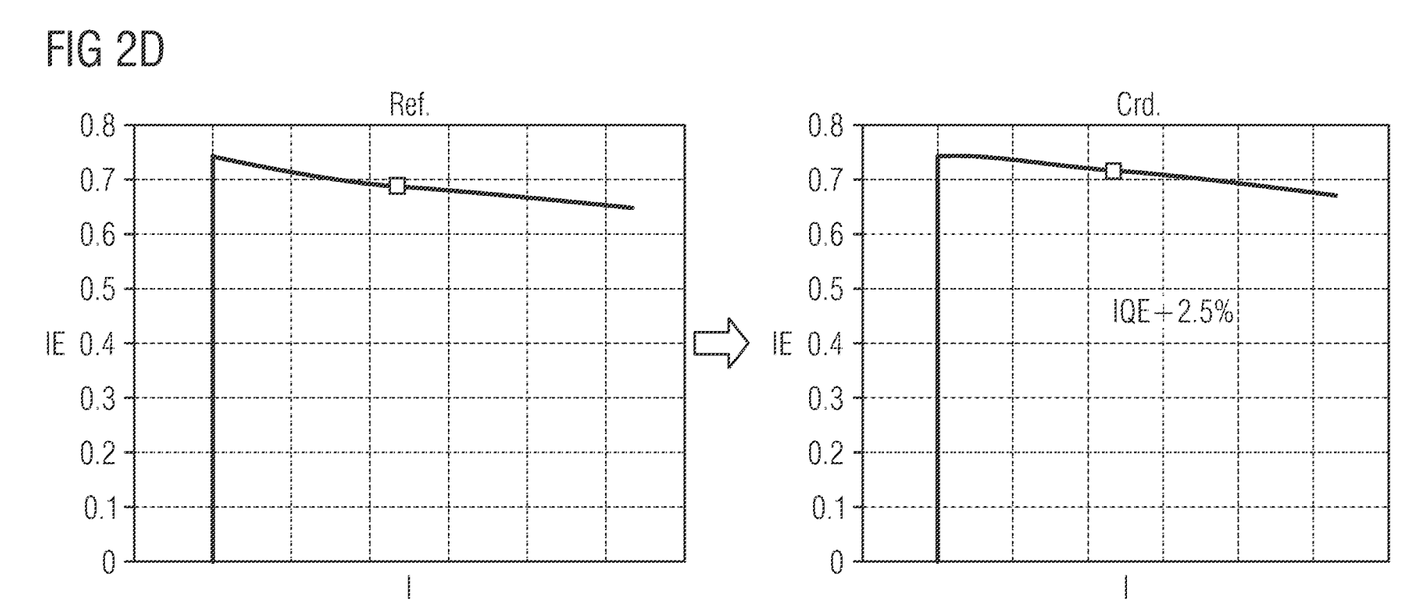

In FIGS. 2B, 2C and 2D, some comparisons between a component 10 having a constant doping profile and a component 10 and having a non-constant doping profile are shown. The quantum barrier layers 32 of the component 10 having a constant doping profile have the reference dopant concentration Ref. In contrast, the quantum barrier layers 32 of the component 10 having the non-constant doping profile exhibit a partially chirped n-doping profile. Thus, only some of the quantum barrier layers 32 have different doping levels, for instance different Si doping levels for the case of the active zone 3 based on InGaN/GaN. For example, only the first three or four quantum barrier layers 32 have varying doping concentrations. This is shown for example in FIG. 2A.

As shown in FIG. 2B, according to simulation, in comparison with the reference case having a constant doping profile, in the case of partially chirped n-doping, the electron transport is hindered for example with chirped Si doping in the quantum barrier layers 32. In this case, the positively charged charge carriers would able to reach deeper or lower quantum well layers 31 and recombine with the electrons in the lower quantum well layers 31 near the n-side semiconductor layer 2. Thus, the radiative recombination rates in the first three quantum well layers 31 are increased, as highlighted on the left-hand side of FIG. 2B.

Compared to FIG. 2B, FIG. 2C shows similar results but in terms of hole concentration HC, i.e. in terms of the distribution of positively charged charge carriers, in the active zone 3, in particular in various quantum well layers QW of the active zone 3. On the left-hand side, FIG. 2C shows the distribution of hole concentration for the case of the quantum barrier layers 32 having a constant doping profile, i.e. having the constant reference dopant concentration Ref. On the right-hand side, FIG. 2C shows the distribution of hole concentration for the case of the quantum barrier layers 32 having non-constant doping profile shown for example in FIG. 2A. In particular, the hole concentration in the multiple quantum well structure may vary between $1E+18/cm^3$ and $2.5E+19/cm^3$. It is possible, that during operation of the component 10, the hole concentration has its largest value in the first three n-side quantum well layers 31.

Thus, going from the case of constant doping profile to the case of non-constant doping profile, the hole concentrations in the first three quantum well layers 31 significantly increase, while the hole concentrations in the remaining quantum well layers 31 are hardly changed or only slightly decrease. This is due to the fact that the electrons are slowed down and the holes are pushed further towards the lower n-side quantum well layers 32, resulting in higher radiative recombination rates in the lower n-side quantum well layers 32. This leads to an increasing internal quantum efficiency IE of the component 10 as shown in FIG. 2D in terms of current I.

Figure 3:
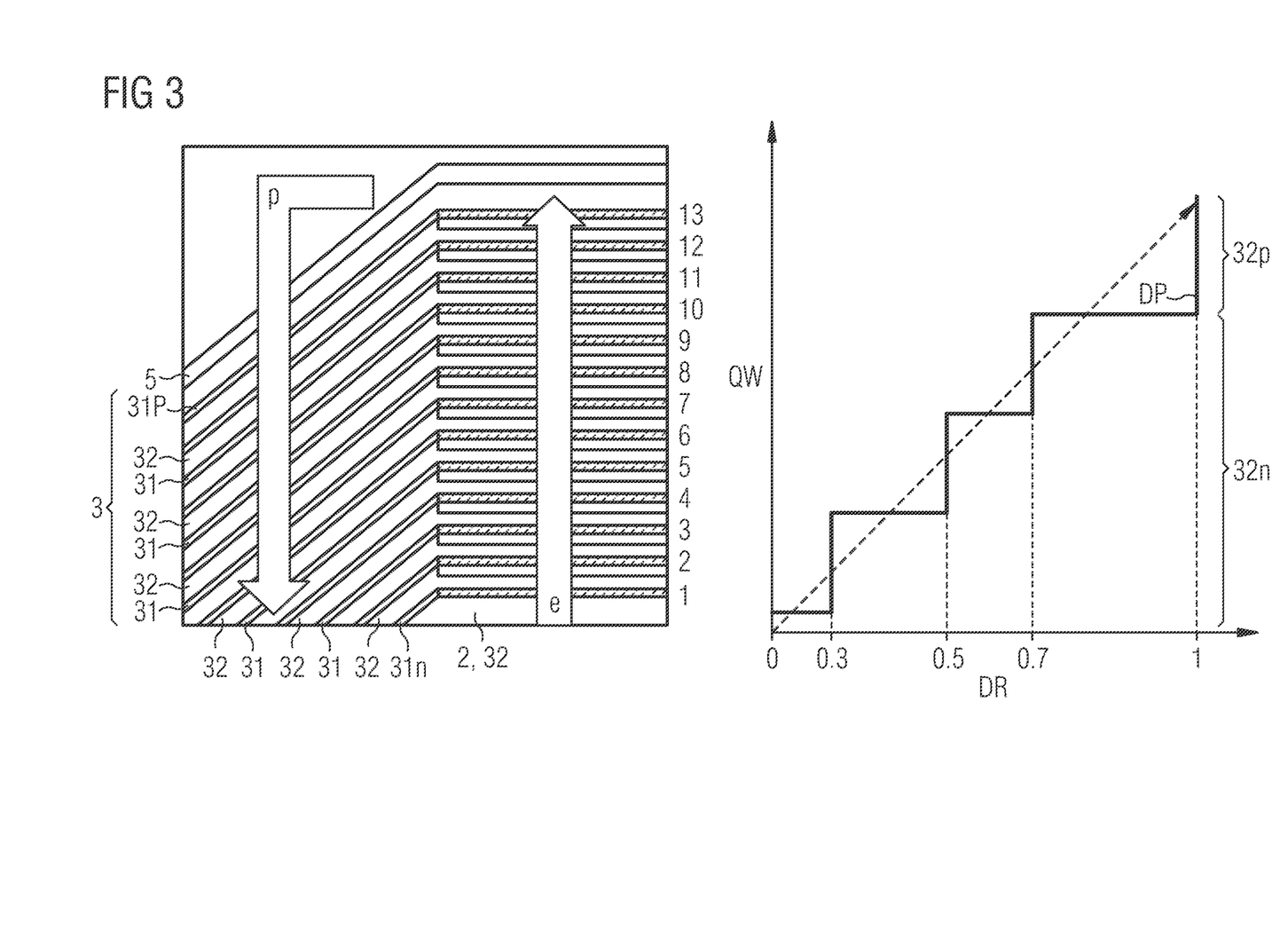
FIG. 3 shows a schematic illustration of another exemplary embodiment of a component.

The exemplary embodiment of a component 10 shown in FIG. 3 substantially corresponds to the exemplary embodiment of a component 10 shown in FIG. 2A. Compared to FIG. 2A showing a partially chirped doping profile, according to FIG. 3, the quantum barrier layers 32 of the component 10 show a fully chirped doping profile.

According to FIG. 3, the quantum barrier layers 32 are divided into a plurality of subgroups, in particular into four subgroups. One of the subgroups is the p-side subgroup which includes p-side quantum barrier layers 32p having the reference dopant concentration Ref. The p-side quantum barrier layers 32p adjoin four quantum well layers 31, namely the quantum well layers 10, 11, 12 and 13. The other three subgroups include n-side quantum barrier layers 32n having dopant concentrations or average dopant concentrations lower than the reference dopant concentration Ref and can be referred to as n-side subgroups.

The first n-side subgroup comprises n-side quantum barrier layers 32n adjoining the first four quantum well layers 31, namely the quantum well layers 1, 2, 3 and 4, and have an average dopant concentration of circa 0.3Ref. The second n-side subgroup comprises n-side quantum barrier layers 32n also adjoining four quantum well layers 31, namely the quantum well layers 4, 5, 6 and 7, and have an average dopant concentration between of circa 0.5Ref. The third n-side subgroup comprises n-side quantum barrier layers 32n adjoining four quantum well layers 31, namely the quantum well layers 7, 8, 9 and 10, and have an average dopant concentration of circa 0.7Ref.

It is possible that up to production tolerances for instance of at most 10%, 7%, 5%, 3% or of at most 1%, the quantum barrier layers 32 of the same subgroup have the same dopant concentration. It is, however, also possible that the quantum barrier layers 32 of the same subgroup have different dopant concentrations. On the right-hand side, FIG. 3 shows the non-constant doping profile DP as a step-like development and as curve fit as a linear fit of the step-like development.

Figure 4:
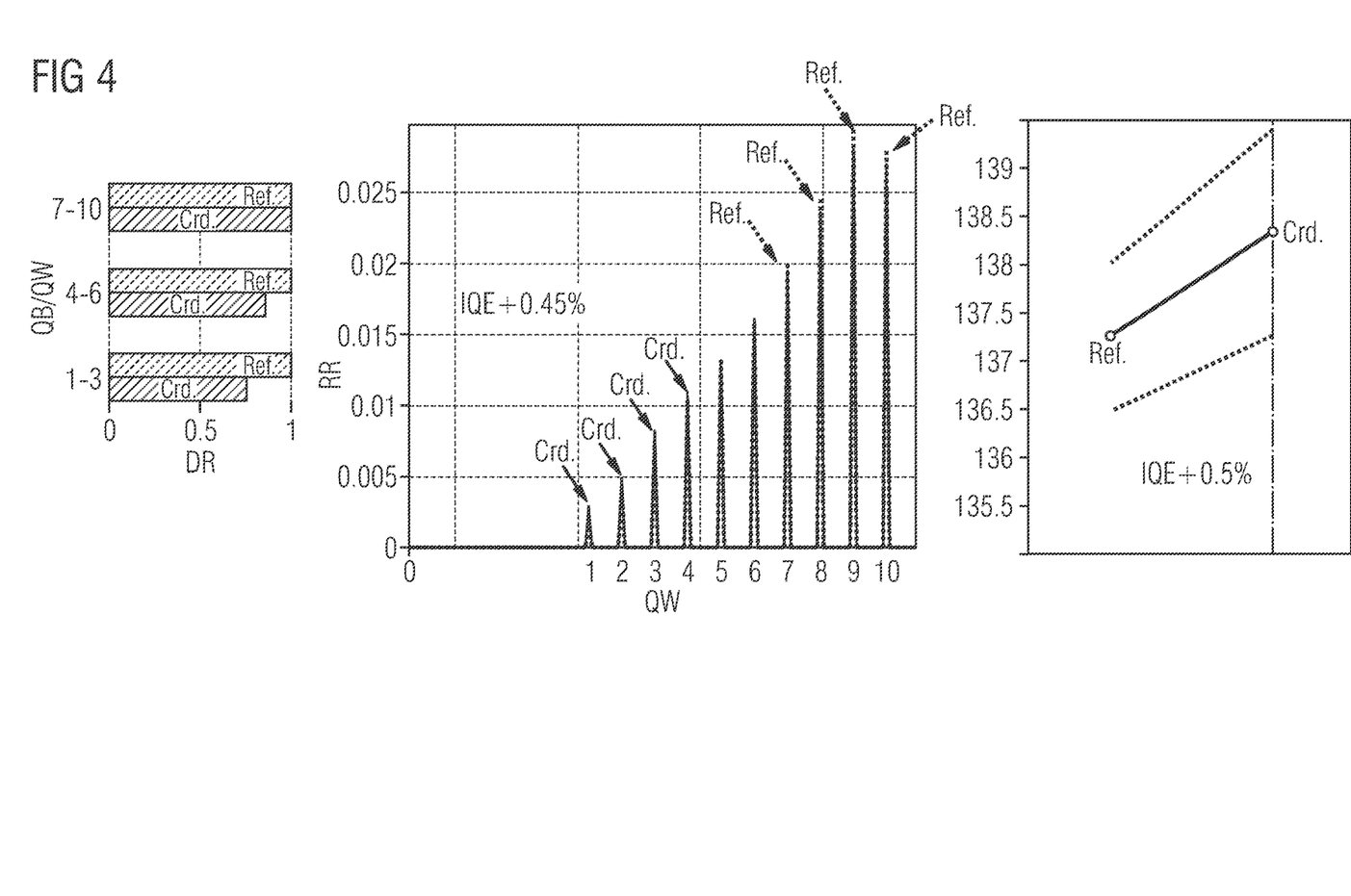
FIG. 4 shows some numerical and experimental results regarding comparisons between component having a constant doping profile and component having a non-constant doping profile.

FIG. 4 shows on the left-hand side a further exemplary embodiment of a component 10 which substantially corresponds to the exemplary embodiment of a component 10 shown in FIG. 2A or in FIG. 3 but only for the quantum barrier layers 32 adjoining the quantum well layers 31 from 1 to 10. Similar to FIG. 3, the chirped quantum barrier layers 32 are divided into a plurality of subgroups, namely into three subgroups. For comparison purposes, the case of the component 10 having a constant doping profile with the reference dopant concentration Ref is also shown.

According to this exemplary embodiment of the component 10, the first subgroup includes quantum barrier layers 32 having a dopant concentration of circa 0.7Ref. The second subgroup includes quantum barrier layers 32 having a dopant concentration of circa 0.85Ref. The third subgroup includes quantum barrier layers 32 having the reference dopant concentration Ref.

At the center, FIG. 4 shows the radiative recombination rate RR at different quantum well layers from 1 to 10 for both cases, namely for the case of the component 10 having a constant doping profile and for the case of the component 10 having a non-constant doping profile.

As shown in FIG. 4, while the radiative recombination rates in the quantum well layers 5 and 6 of both cases are almost equal, the component 10 having the non-constant doping profile has higher radiative recombination rates in the lower n-side quantum well layers 1, 2, 3 and 4, and has lower radiative recombination rates in the higher p-side quantum well layers 7, 8, 9 and 10. This is an indication that for the component 10 having the non-constant doping profile, the charged carrier distribution is homogenized to a higher degree throughout the active zone 3. This results in an increasing internal quantum efficiency IQE of about 0.45-0.5% for the component 10 having the non-constant doping profile as explicitly shown on the right-hand side of FIG. 4.

Thus, as one possibility for improving the hole distribution in a MQW structure, according to this disclosure, partially worsening the electron transport in particular in the n-side quantum barrier layers is suggested in order to make the hole flowing deeper into the lower QWs. This can be achieved via partially or fully chirped n-doping the quantum barrier layers in the active zone. In particular, in case of a V-pits enhanced InGaN/GaN LED structure, the quantum barrier layers can be n-doped with Si to make the transport of electrons through a c-plane without costing extra voltage.

Moving away from a constant doping level, for instance from a constant Si doping level in each QBs within the MQW structure, a non-constant chirped doping profile is suggested. In particular, the doping level or the dopant concentration in the quantum barrier layers shall gradually increase from a n-side semiconductor layer towards a p-side semiconductor layer. This can be achieved by partially or fully chirped doping the quantum barrier layers. Thus, the electron transport would be effectively hindered or slowed down, in particular due to the chirped Si doping in the quantum barrier layers. In this case, positively charged charge carriers would able to be transported deeper into the n-side active zone and recombine with electrons in lower or deeper QWs near the n-side semiconductor layer, thus increasing the radiative recombination rate and the internal quantum efficiency of the component. This effect has been proven by both simulation and experiment. Moreover, it has been found that the approach of adjusting the hole distribution via adjusting the electron transport is much more flexible than changing the p-side growth conditions for adjusting the hole distribution.

The invention is not restricted to the exemplary embodiments by the description of the invention made with reference to the exemplary embodiments. The invention rather comprises any novel feature and any combination of features, including in particular any combination of features in the claims, even if this feature or this combination is not itself explicitly indicated in the claims or in the exemplary embodiments.

The invention claimed is:
1. A component comprising:
a semiconductor layer sequence comprising a p-side semiconductor layer, an n-side semiconductor layer and an active zone located therebetween,
wherein the active zone has a multiple quantum well structure comprising a plurality of quantum barrier layers and quantum well layers, the quantum barrier layers and the quantum well layers being arranged alternately along a vertical direction, wherein the active zone comprises at least one recess having facets extending obliquely to a main surface of the active zone, the recess being opened towards the p-side semiconductor layer, wherein, at least within the recess, the quantum barrier layers are n-doped and have a non-constant doping profile so that the component is configured to increase transport of negatively charged charge carriers, from the n-side semiconductor layer towards the p-side semiconductor layer, based on the non-constant doping profile, and wherein, from the n-side semiconductor layer towards the p-side semiconductor layer, dopant concentrations of the quantum barrier layers gradually increase.

2. The component according to claim 1,
wherein the active zone comprises a plurality of recesses having facets extending obliquely to the main surface of the active zone, the recesses being opened towards the p-side semiconductor layer, and
wherein, in each of the plurality of recesses, the quantum barrier layers are n-doped and have the non-constant doping profile.

3. The component according to claim 1,
wherein the quantum barrier layers are divided into a plurality of subgroups,
wherein, up to production tolerances, the quantum barrier layers of the same subgroup have the same dopant concentration, and
wherein the quantum barrier layers of different subgroups have different dopant concentrations.

4. The component according to claim 3, wherein each subgroup of the quantum barrier layers has an average dopant concentration, and wherein, from the n-side semiconductor layer towards the p-side semiconductor layer, average dopant concentrations of different subgroups gradually increase.

5. The component according to claim 1,
wherein the quantum barrier layers are divided into p-side quantum barrier layers and n-side quantum barrier layers,
wherein, up to production tolerances, the p-side quantum barrier layers have the same dopant concentration,
wherein one of the p-side quantum barrier layers has a highest dopant concentration of all quantum barrier layers, wherein the p-side quantum barrier layers are located between the p-side semiconductor layer and the n-side quantum barrier layers, and wherein all n-side quantum barrier layers have lower dopant concentrations than the p-side quantum barrier layers.

6. The component according to claim 5,
wherein the non-constant doping profile in the multiple quantum well structure is reflected by different dopant concentrations of the n-side quantum barrier layers, and
wherein, from the n-side semiconductor layer towards the p-side semiconductor layer, the dopant concentrations of the n-side quantum barrier layers gradually increase.

7. The component according to claim 5, wherein at least one or one first subgroup of the n-side quantum barrier layers has the lowest dopant concentration of all quantum barrier layers.

8. The component according to claim 5, wherein at least 10% and at most 90% of all quantum barrier layers in the multiple quantum well structure are n-side quantum barrier layers.

9. The component according to claim 5, wherein at least 10% and at most 70% of all quantum barrier layers in the multiple quantum well structure are n-side quantum barrier layers.

10. The component according to claim 5, wherein at least 10% and at most 50% of all quantum barrier layers in the multiple quantum well structure are n-side quantum barrier layers.

11. The component according to claim 5, wherein at least 10% and at most 30% of all quantum barrier layers in the multiple quantum well structure are n-side quantum barrier layers.

12. The component according to claim 1,
wherein, from the n-side semiconductor layer towards the p-side semiconductor layer, the dopant concentrations of the quantum barrier layers gradually increase individually or in groups, and
wherein different quantum barrier layers or different subgroups of quantum barrier layers have different dopant concentrations.

13. The component according to claim 1, wherein the quantum barrier layers outside the recess are n-doped and exhibit the non-constant doping profile.

14. The component according to claim 1, wherein the semiconductor layer sequence or the active zone is based on an InGaN/GaN structure.

15. The component according to claim 1, wherein the quantum barrier layers are doped with Si.

* * * * *